(12) United States Patent
Hino et al.

(10) Patent No.: US 7,423,342 B2
(45) Date of Patent: Sep. 9, 2008

(54) METHOD FOR ASSEMBLING SEMICONDUCTOR SWITCHING ELEMENTS AND HEAT SINK IN ROTARY ELECTRIC MACHINE AND ROTARY ELECTRIC MACHINE

(75) Inventors: Yasunari Hino, Tokyo (JP); Hiroyuki Akita, Tokyo (JP); Masaki Kato, Tokyo (JP); Yoshihito Asao, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 347 days.

(21) Appl. No.: 11/300,489

(22) Filed: Dec. 15, 2005

(65) Prior Publication Data

US 2006/0175906 A1    Aug. 10, 2006

(30) Foreign Application Priority Data

Dec. 21, 2004  (JP)  .............................. 2004-369734

(51) Int. Cl.
*H01L 23/34* (2006.01)
*H01L 23/10* (2006.01)
*H01L 21/50* (2006.01)
*H01L 21/48* (2006.01)
*H01L 21/44* (2006.01)

(52) U.S. Cl. ..................... 257/707; 257/706; 438/121; 438/122; 438/124

(58) Field of Classification Search ................. 257/706, 257/707; 438/121, 122, 124
See application file for complete search history.

(56) References Cited

U.S. PATENT DOCUMENTS

| 5,719,487 | A  | * | 2/1998  | Sato et al. ..................... 322/28 |
| 6,272,015 | B1 | * | 8/2001  | Mangtani ..................... 361/707 |
| 6,977,475 | B2 | * | 12/2005 | Kuribayashi et al. ........ 318/140 |

FOREIGN PATENT DOCUMENTS

| JP | 08-289505   | A | 1/1996 |
| JP | 09-252563   | A | 9/1997 |
| JP | 2000-022021 | A | 1/2000 |

* cited by examiner

*Primary Examiner*—Luan Thai
(74) *Attorney, Agent, or Firm*—Sughrue Mion, PLLC (57) ABSTRACT

A method for assembling semiconductor switching elements and a heat sink in a rotary electric machine includes: a first step in which bare chips of the semiconductor switching elements are bonded to the heat sink using a good heat conductive bonding material; a second step which connects the bare chips to a wiring part by wire bonding; and a third step in which a resin which seals the bare chips and the wiring part is applied to the heat sink in a striding manner in a state that output terminal portions of the wiring part and fins of the heat sink are exposed to the outside of the resin.

9 Claims, 7 Drawing Sheets

Fig. 1

⟹ : Cooling air flow

METHOD FOR ASSEMBLING SEMICONDUCTOR SWITCHING ELEMENTS AND HEAT SINK IN ROTARY ELECTRIC MACHINE AND ROTARY ELECTRIC MACHINE

BACKGROUND OF THE INVENTION

1. Field of the Invention

The present invention relates to a method for assembling semiconductor switching elements and a heat sink in a rotary electric machine which is mounted in a limiting space such as an electric automobile, a hybrid vehicle, an idling stop vehicle or the like and a rotary electric machine.

2. Description of the Related Art

Recently, to achieve the prevention of global warming, the reduction of $CO_2$ emission is requested. Particularly, an electric automobile, a hybrid vehicle and an idling stop vehicle which can enhance the mileage performance by the idling stop at the time of stopping a vehicle, the regeneration of energy during the deceleration traveling and the torque assisting during the acceleration traveling have been developed and put into practice.

As described in Japanese Patent Laid-open Hei 8(1996)-289505 (see FIG. 1 to FIG. 5 and explanation thereof), in the control device structure in a control-device integral-type motor which includes semiconductor switching elements, the semiconductor switching elements are mounted on a substrate on which a circuit pattern is formed and is basically formed of metal having a high heat radiation property while including an insulation layer.

Further, the above-mentioned substrate is, for enhancing the cooling performance, mounted on a heat sink using bolts by way of grease to enhance the cooling property.

Figure 11:
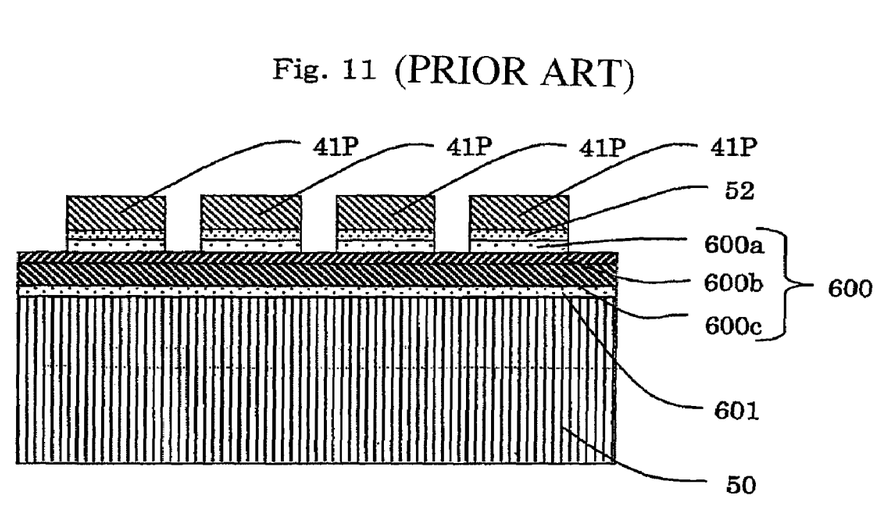
FIG. 11 is a longitudinal cross-sectional side view showing an example of the structure after assembling semiconductor switching elements and a heat sink in a conventional rotary electric machine.

In general, in the inside of the control device, as shown in FIG. 11, packaged semiconductor switching elements 41P are bonded to a metal substrate 600 which is constituted of a metal base plate made of Al or the like, a pattern 600a made of copper or the like, an insulation layer 600b and a metal base plate 600c by soldering 52. The semiconductor switching elements 41P are configured such that chips are connected to a heat spreader and the chips are individually packaged with a resin. The metal substrate 600 on which the packaged semiconductor switching elements 41P are mounted is connected to the heat sink 50 using bolts by way of grease 601.

For example, to illustrate a case of the control-device integral-type electrically-operated generator for an automobile, there exist following kinds of drawbacks to be solved.

In connecting a motor control device and the electrically-operated generator, when the control device and the electrically-operated generator are separated from each other, particularly, when the control device and the electrically-operated generator are largely separated from each other, a wiring length is increased and hence, a wiring resistance is increased thus giving rise to a large voltage drop whereby it is difficult to obtain desired torque characteristics and a rotational speed.

Further, the elongation of the wiring gives rise to drawbacks such as the increase of weight and the increase of cost.

In a limited installation space such as the inside of an engine room or the like, it is extremely difficult to ensure a space for installing the electrically-operated generator and, at the same time, to incorporate the control device in the inside of the electrically-operated generator, it is necessary to miniaturize the whole structure of the control device.

In the inside of the control device, it is necessary to cool the semiconductor elements having a large heat value such as power semiconductor switching elements for a main circuit or the like and hence, a heat sink (a radiator) for cooling the semiconductor elements becomes large-sized and substantially occupies a major portion of a volume of the control device. To cope with the high output specification which is expected in future, the heat sink size is increased and the heat sink may not be accommodated in the inside of the electrically-operated generator.

Conventionally, the semiconductor elements are mounted on the metal substrate and, thereafter, the metal substrate is mounted on the heat sink by way of grease. Since the insulation layer having small heat conductivity is interposed in the inside of the substrate, the heat resistance is increased and the heat radiation is extremely lowered. To cope with such a situation, it is necessary to increase the size of the heat sink and this makes it difficult to accommodate the heat sink in the inside of the electrically-operated generator.

Further, the semiconductor elements used in the electrically-operated generator exhibit a particularly large loss quantity and consume large heat content. The metal substrate contains silica as a filler in a portion of an insulation material and also uses other high-grade material thus pushing up a manufacturing cost.

Further, since the substrate is mounted on the heat sink, a grease coating step, a fixing step using bolts and the like become necessary thus exhibiting the poor productivity.

When the semiconductor elements are directly mounted on the heat sink, the heat sink forms electrodes and it is difficult to ensure the insulation against the respective electrodes.

Further, the connection and the wiring of the semiconductor elements with surrounding part connecting portions become complicated and difficult.

It is necessary to enhance the productivity and, at the same time, it is necessary to acquire the reduction of cost.

SUMMARY OF THE INVENTION

The present invention has been made in view of the above-mentioned circumstances and it is an object of the present invention to realize, in a rotary electric machine which includes a rotary electric machine part, a switching circuit part which performs an electricity supply control of the rotary electric machine part, and a heat sink which cools semiconductor switching elements constituting the switching circuit part, and mounts the switching circuit part and the heat sink on the rotary electric machine part, the enhancement of the heat radiation of the semiconductor switching elements which require cooling and the miniaturization of the rotary electric machine which is arranged in a limited space which is required to be satisfied by arranging a down-sized heat sink in the inside of the limited space.

The present invention is directed to a method for assembling semiconductor switching elements and a heat sink in a rotary electric machine which includes a rotary electric machine part, a switching circuit part which performs an electricity supply control of the rotary electric machine part, and the heat sink which cools the semiconductor switching elements, the switching circuit part and the heat sink being mounted on the rotary electric machine part, wherein the method includes a first step in which bare chips of the semiconductor switching elements are bonded to the heat sink using a good heat conductive bonding material, a second step which connects the bare chips to a wiring part by wire bonding, and a third step in which a resin which seals the bare chips and the wiring part is applied to the heat sink in a striding manner in a state that output terminal portions of the wiring part and fins of the heat sink are exposed to the outside of the resin.

Accordingly, a heat spreader becomes unnecessary. Since the semiconductor switching elements are bonded to the heat sink using the good heat conductive bonding material without interposing the metal substrate which includes the circuit pattern and the insulation layer therebetween, the heat resistance corresponding to copper or the insulation layer is eliminated. Accordingly, the heat radiation of the semiconductor switching elements which require cooling can be enhanced whereby it is possible to arrange the heat sink in the inside of a limited space by reducing the size of the heat sink thus realizing the miniaturization that the rotary electric machine which is arranged in the inside of the limited space is requested to satisfy.

DESCRIPTION OF THE PREFERRED EMBODIMENTS

Embodiment 1

Figure 1:
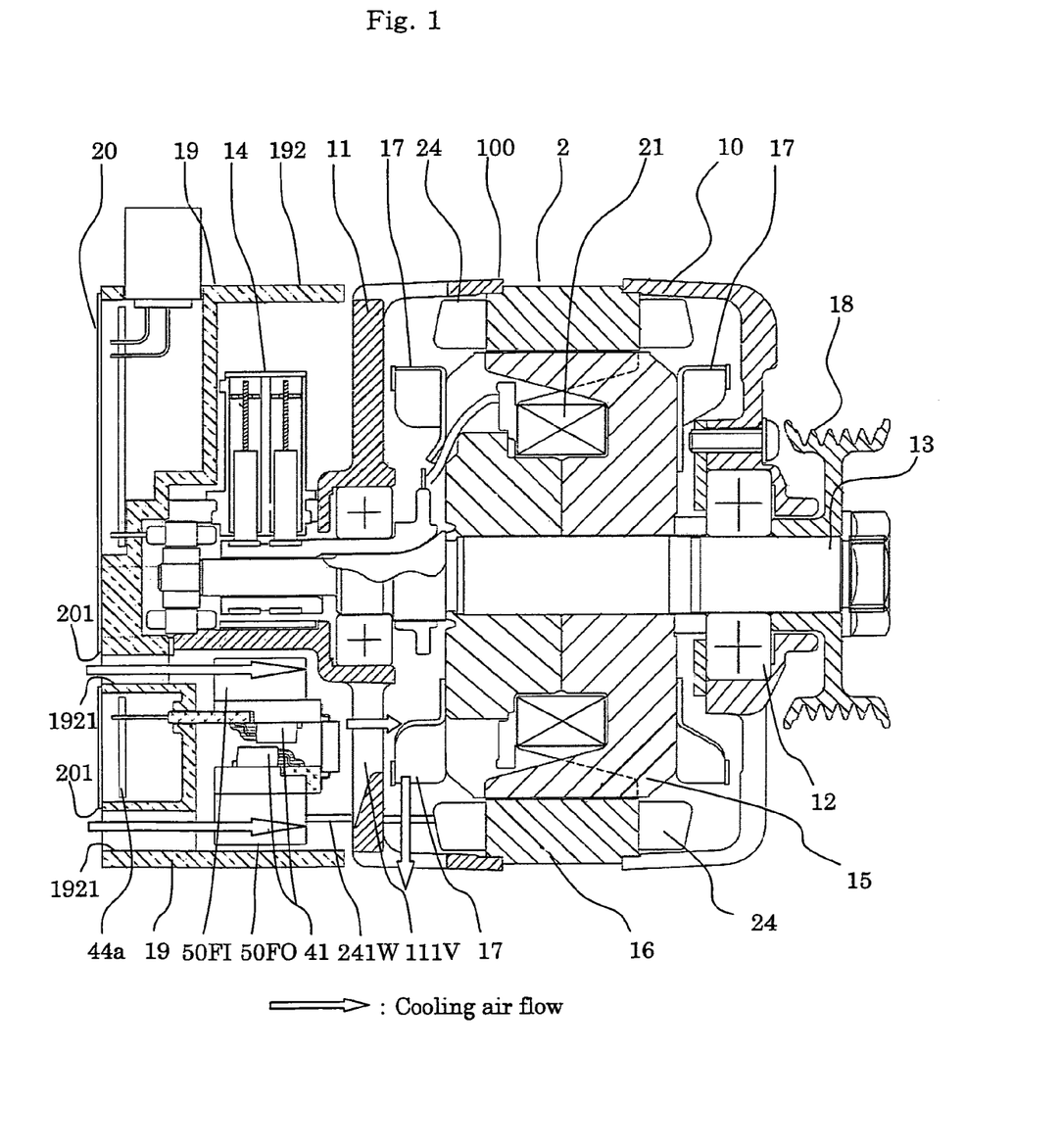
FIG. 1 is a view showing an embodiment 1 of the present invention and also is a longitudinal cross-sectional side view showing an example of the structure of a rotary electric machine.
Figure 2:
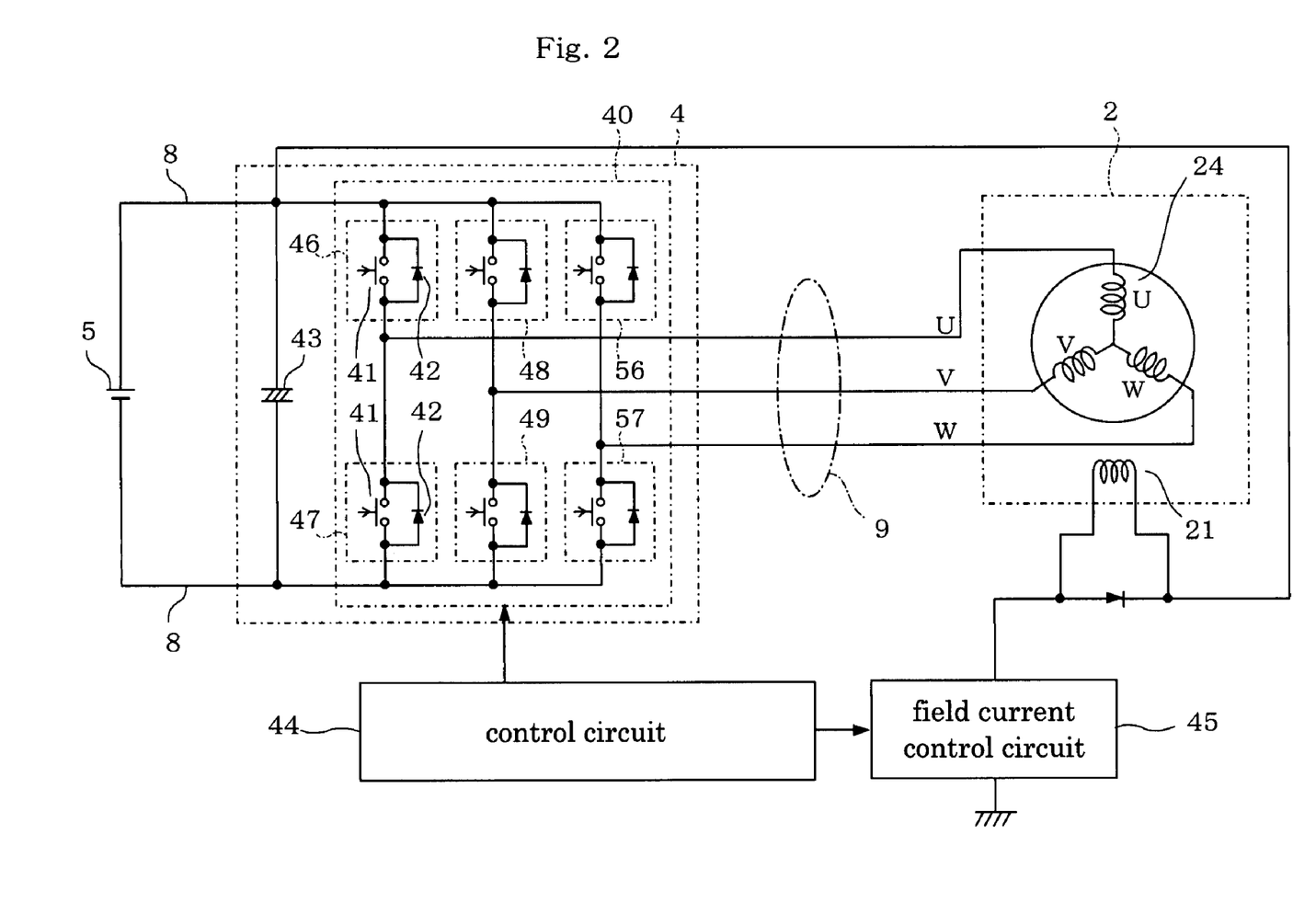
FIG. 2 is a view showing the embodiment 1 of the present invention and also is a view showing an example of a schematic circuit for explaining an operation of the rotary electric machine.
Figure 3:
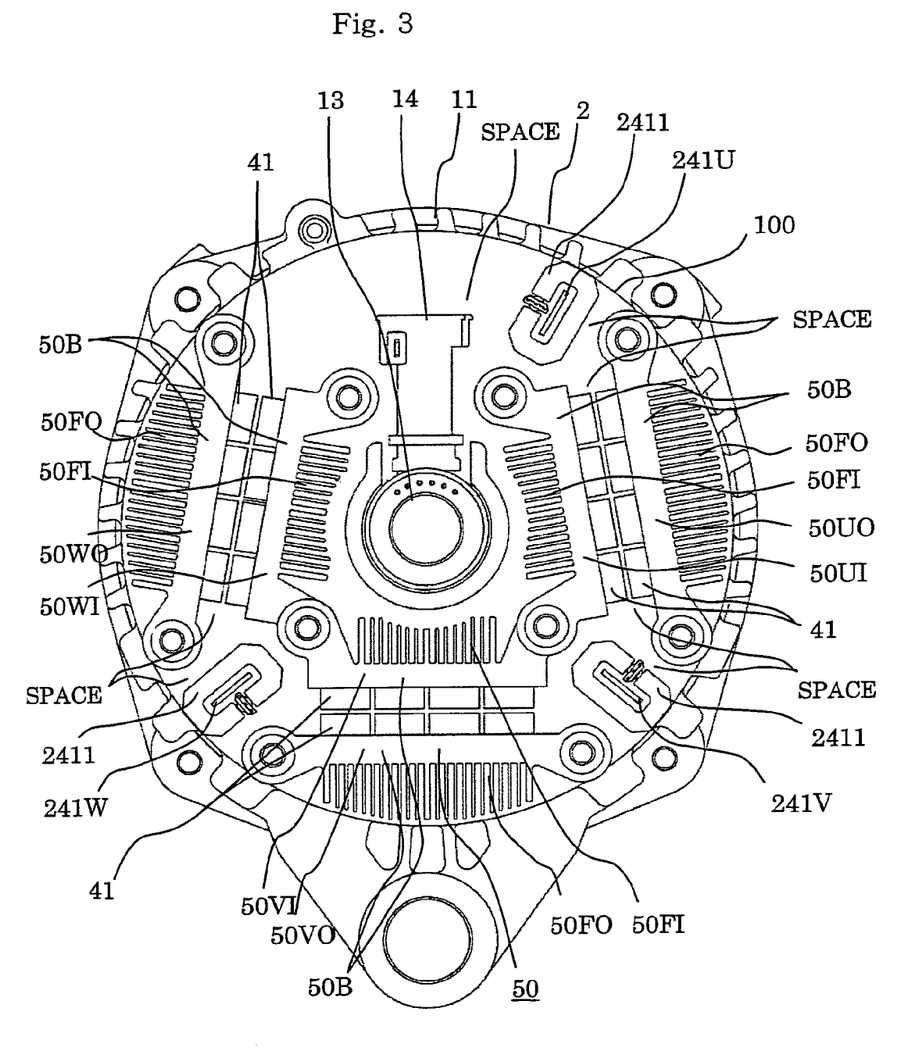
FIG. 3 is a view showing the embodiment 1 of the present invention and also is a plan view showing an arrangement example of a heat sink of the rotary electric machine.
Figure 4:
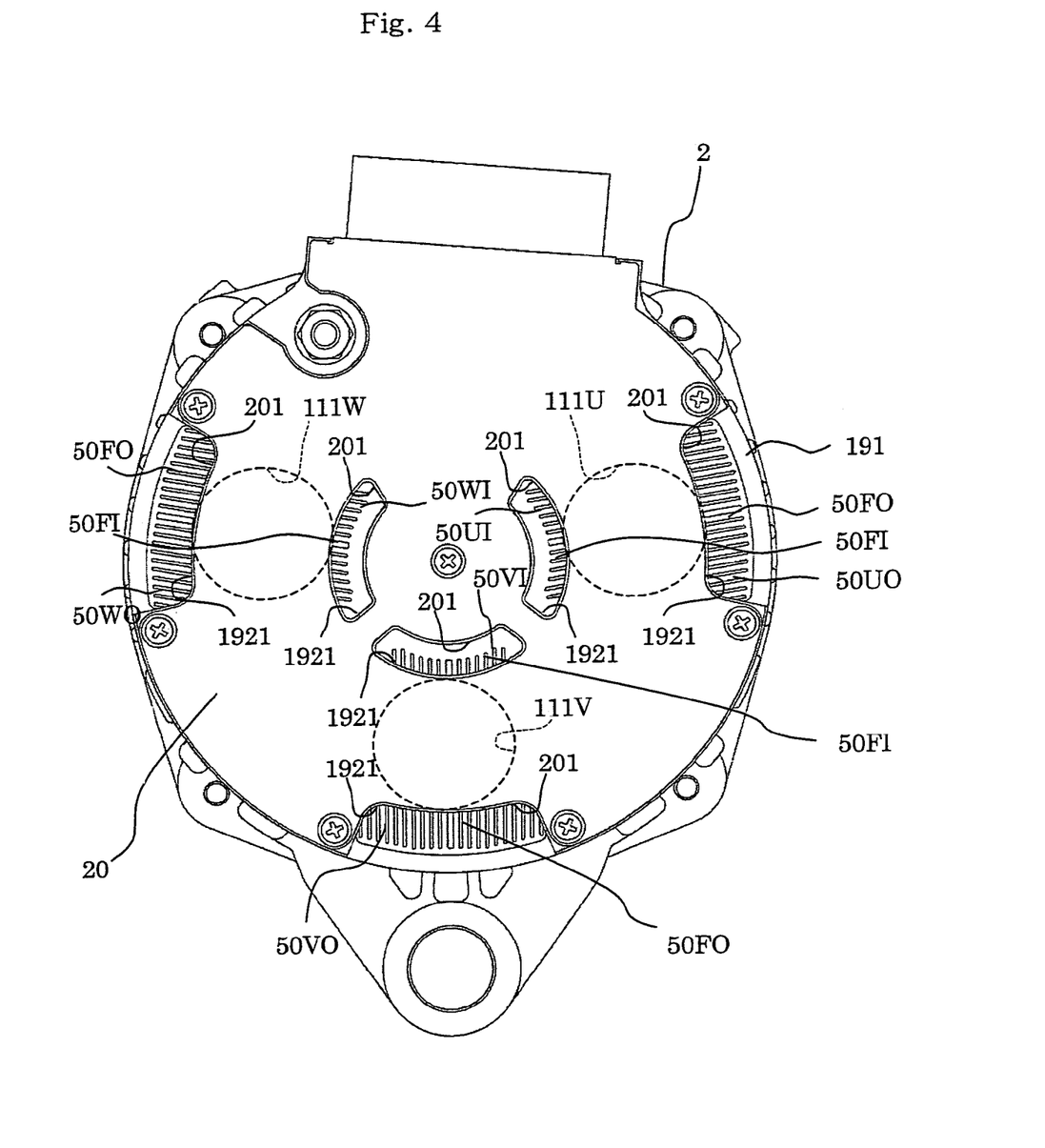
FIG. 4 is a view showing the embodiment 1 of the present invention and also is a plan view showing an example as viewed from a rear side of the rotary electric machine.
Figure 5:
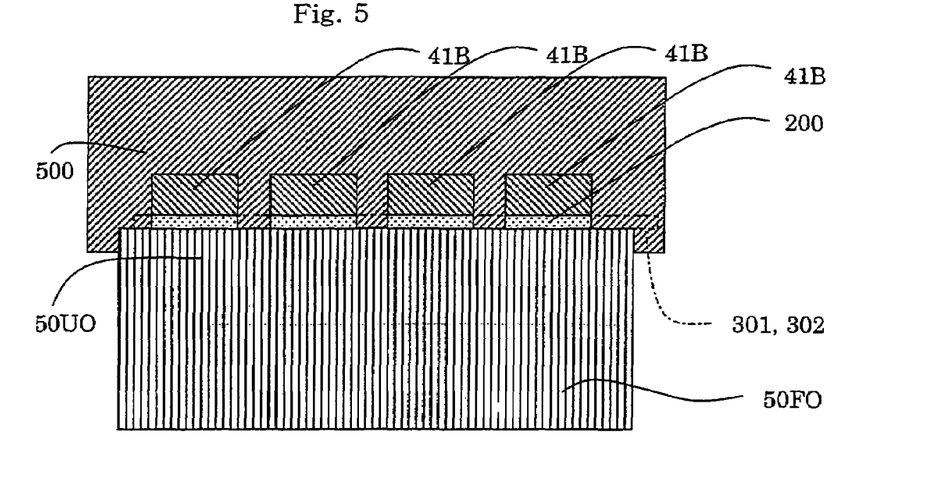
FIG. 5 is a view showing the embodiment 1 of the present invention and also is a longitudinal cross-sectional side view showing an example of the structure after assembling semiconductor switching elements and a heat sink in a cross section.
Figure 6:
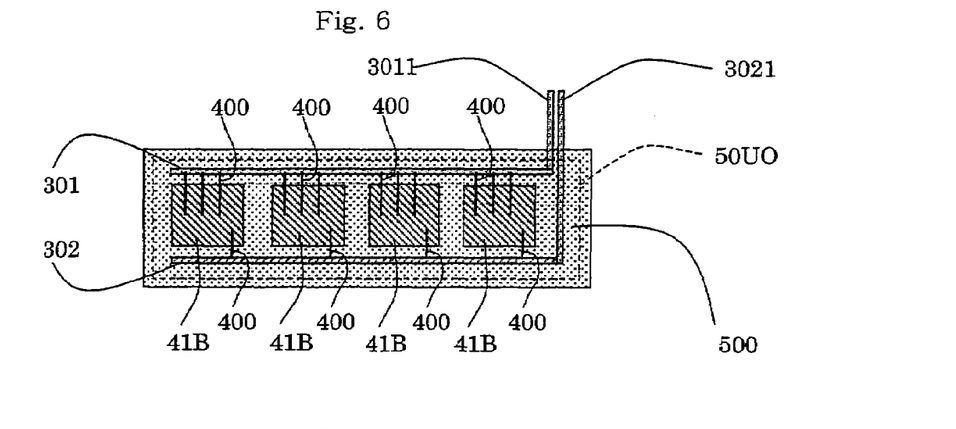
FIG. 6 is a view showing the embodiment 1 of the present invention and also is a contracted lateral cross-sectional plan view showing an example of the structure after assembling semiconductor switching elements and a heat sink in a cross section.

An embodiment 1 of the present invention is explained hereinafter in conjunction with FIG. 1 to FIG. 5. FIG. 1 is a longitudinal cross-sectional side view showing an example of the structure of a rotary electric machine, FIG. 2 is a view showing an example of a schematic circuit for explaining an operation of the rotary electric machine, FIG. 3 is a plan view showing an arrangement example of a heat sink of the rotary electric machine, FIG. 4 is a plan view showing an example of the rotary electric machine as viewed from a rear side of the rotary electric machine, FIG. 5 is a longitudinal cross-sectional side view showing an example of the structure after assembling semiconductor switching elements and a heat sink in cross section, and FIG. 6 is a contracted lateral cross-sectional side view showing an example of the structure after assembling the semiconductor switching elements and the heat sink. Here, in respective drawings, the same symbols indicate identical portions.

In FIG. 1, FIG. 3 and FIG. 4, a rotary electric machine part 2 includes a casing 100 which is constituted of a front bracket 10 and a rear bracket 11, a rotary shaft 13 which is rotatably arranged in the casing by way of support bearings 12, a brush 14, a rotor 15 which is fixed to the rotary shaft 13 and includes a field winding 21 to which electricity is supplied through the brush 14, a stator 16 which is fixed to the casing 100, is arranged to surround the rotor 15 and has an armature winding 24, a fan 17 formed of a centrifugal fan which is fixed to both axial end surfaces of the rotor 15, and a pulley 18 which is fixedly mounted on a front side of the rotary shaft 13. Here, the rotary electric machine part 2 is connected to a rotary shaft of an engine (not shown in the drawings) by way of the above-mentioned pulley 18 and a belt (not shown in the drawing).

In this embodiment, a switching circuit part 4 which is formed of a power element unit is mounted integrally with the rotary electric machine part 2 or is arranged in the vicinity of the rotary electric machine part 2. On a rear side of the rear bracket 11, a plurality of semiconductor switching elements 41 which constitute the switching circuit part 4, and heat sinks 50UI, 50UO, 50VI, 50VO, 50WI, 50WO to which the respective semiconductor switching elements 41 are mounted are arranged. These heat sinks 50UI, 50UO, 50VI, 50VO, 50WI, 50WO constitute a heat radiation device 50. Here, U, V, W in the symbols 50UI, 50UO, 50VI, 50VO, 50WI, 50WO imply a U phase, a V phase and a W phase in a three-phase alternating current described later, symbol I indicates a radial inner side of the rotary shaft 13, and symbol O implies a radial outer side of the rotary shaft 13.

The plurality of semiconductor switching elements 41 are mounted on a planar surface of a radial outer linear proximal portion 5GB of each one of the above-mentioned heat sinks 50UI, 50VI, 50WI, while a heat radiation portion 50FI, which is formed of a large number of fins which form a heat transmission surface for conducting heat generated by the respective semiconductor switching elements 41 and for radiating the heat in cooling air, is formed on the radial inner side. Further, the large number of fins formed on the heat radiation portion 50FI extend in the longitudinal direction (the extending direction of an axis) of the rotary shaft 13, that is, the direction along which cooling air flows and extends in parallel to the radial direction, while gaps between end surfaces of the respective fins on the rotary shaft 13 side and an outer peripheral surface of the rotary shaft 13 are set to equal distances.

The plurality of semiconductor switching elements 41 are mounted on a planar surface of the above-mentioned radial inner linear proximal portion 50B of each one of the above-mentioned heat sinks 50UO, 50VO, 50WO, while a heat radiation portion 50FO which is formed of a large number of fins which form a heat transmission surface for conducting heat generated by the own semiconductor switching elements 41 for radiating the heat in cooling air is formed on the radial outer side. Further, the large number of fins formed on the heat radiation portion 50FO extend in the longitudinal direction (the extending direction of an axis) of the rotary shaft 13, that is, in the direction along which cooling air flows and extends in parallel to the radial direction, while gaps formed between end surfaces of the respective fins on an inner-peripheral-surface side of an insert casing 19 described later and an inner peripheral surface of the insert casing 19 are set to the equal distance.

Here, both of the above-mentioned heat sinks 50UI, 50UO are formed of a U-phase heat sink, while the plurality of semiconductor switching elements 41 of each heat sink are formed of a U-phase semiconductor switching element shown in FIG. 2 described later. In the same manner, both of the above-mentioned heat sinks 50VI, 50VO are formed of a V-phase heat sink, while the plurality of semiconductor switching elements 41 of each heat sink are formed of a V-phase semiconductor switching element shown in FIG. 2 described later. In the same manner, both of the above-mentioned heat sinks 50WI, 50WO are formed of a W-phase heat sink, while the plurality of semiconductor switching elements 41 of each heat sink are formed of a W-phase semiconductor switching element shown in FIG. 2 described later.

On a rear side of the switching circuit part 4, the insert casing 19 which mounts a control circuit board 44a thereon and a cover 20 which covers a rear-side opening of the insert casing 19 are arranged. Here, in the control circuit board 44a, a control circuit 44 which performs a control of supply of electricity to the rotary electric machine part by performing a switching control of the respective semiconductor switching elements of the switching circuit part 4 is incorporated.

The insert casing 19 is constituted of a cylindrical outer peripheral wall portion 191 which is coaxial with the rotary shaft 13 and a partition wall portion 192 which extends in the above-mentioned radial direction while striding over the rotary shaft 13 and the outer peripheral wall portion 191, and is fixed to the rear bracket 11 or the like.

The above-mentioned outer peripheral wall portion 191 surrounds the heat sinks 50UI, 50UO, 50VI, 50VO, 50WI, 50WO, the brush 14, and lead lines 241U, 241V, 241W of the armature winding 24. That is, the heat sinks 50UI, 50UO, 50VI, 50VO, 50WI, 50WO and the brush 14 are arranged to be positioned on the common radial plane in a space defined between the outer peripheral wall portion 191 and the rotary shaft 13.

The control circuit 44 is arranged in a space surrounded by the outer peripheral portion 191, the partition wall portion 192 and the cover 20, and is shielded from an external environment.

With respect to the above-mentioned cover 20, as shown in FIG. 4, cooling air intake ports 201 which directly face the rotary shaft 13 in the longitudinal direction are formed in the respective heat radiation portions 50FI, 50FI, 50FI, 50FO, 50FO, 50FO of the heat sinks 50UI, 50UO, 50VI, 50VO, 50WI, 50WO. Also with respect to the above-mentioned partition wall portion 192, ventilation holes 1921 which are overlapped to the above-mentioned cooling air intake ports 201 in the longitudinal direction of the rotary shaft 13 are formed in the respective heat radiation portions 50FI, 50FI, 50FI, 50FO, 50FO, 50FO of the heat sinks 50UI, 50UO, 50VI, 50VO, 50WI, 50WO, wherein the ventilation holes 1921 directly face the rotary shaft 13 along the longitudinal direction of the rotary shaft 13.

Further, as indicated by a dotted line in FIG. 4, in the above-mentioned rear bracket 11, a ventilation hole 111U which corresponds to the heat sinks 50UI, 50UO, a ventilation hole 111V which corresponds to the heat sinks 50VI, 50VO, and a ventilation hole 111W which corresponds to the heat sinks 50WI, 50WO are formed.

The rotary electric machine includes the above-mentioned rotary electric machine part 2, the switching circuit part 4 (described later in conjunction with FIG. 2) which performs a control of the supply of electricity to the rotary electric machine part 2, and the heat radiation device 50 which cools the plurality of semiconductor switching elements 41 which constitute the switching circuit part 4. Here, the heat radiation device 50 is constituted of the plurality of heat sinks 50UI, 50VI, 50WI, (50UO, 50VO, 50WO) which are arranged in parallel in a state that the heat sinks surround the rotary shaft 13 in the circumferential direction of the rotary shaft 13 in a common surface which surrounds the rotary shaft 13 of the rotary electric machine part 2 and to which the plurality of the semiconductor switching elements 41 are mounted in a scattered manner respectively. In other words, the above-mentioned heat sinks are divided in a plural number (50UI, 50VI, 50WI) (50UO, 50VO, 50WO) in the circumferential direction, and the heat sinks are arranged substantially in the whole circumferential direction. Accordingly, a pressure loss generated when the cooling air is allowed to pass the heat radiation device 50 can be reduced and hence, the lowering of cooling air volume can be suppressed whereby the cooling performance of the semiconductor switching elements 41 can be enhanced. Further, it is also possible to suppress wind noises attributed to the ventilation resistance.

A space SPACE is formed between heat sinks which are arranged close to each other in the circumferential direction of the rotary shaft 13 (between 50UI and 50VI, between 50VI and 50WI, between 50WI and 50UI) (between 50UO and 50VO, between 50VO and 50WO, between 50WO and 50UO), and the lead line 241 of the rotary electric machine part 2 is arranged in the inside of the space SPACE. Accordingly, it is possible to effectively make use of the space around the rotary shaft 13 thus realizing the miniaturization of the rotary electric machine in the radial direction.

The brush 14 which supplies electricity to the rotor 15 of the rotary electric machine part 2 and the plurality of heat sinks 50UI, 50VI, 50WI (50UO, 50VO, 50WO) are arranged in parallel in a state that the heat sinks surround the rotary shaft 13 in the circumferential direction of the rotary shaft 13 on a common surface which surrounds the rotary shaft 13 of the rotary electric machine part 2. Accordingly, it is possible to effectively make use of the space around the rotary shaft 13 thus realizing the miniaturization of the rotary electric machine in the radial direction.

The plurality of heat sinks which are arranged in parallel in a state that the heat sinks surround the rotary shaft 13 in the circumferential direction of the rotary shaft 13 and to which the plurality of semiconductor switching elements 41 are mounted respectively in a scattered manner are arranged in parallel in the radial direction of the rotary shaft (50UI, 50VI, 50WI and 50UO, 50VO, 50WO). In other words, the heat sinks are divided in a plural number in the radial direction (50UI, 50VI, 50WI and 50UO, 50VO, 50WO) and are arranged in the substantially whole radial direction. Accordingly, a pressure loss generated when the cooling air is allowed to pass through the heat radiation device 50 can be reduced and hence, the lowering of a cooling air volume can be suppressed whereby the cooling performance of the semiconductor switching elements 41 can be enhanced. Further, it is also possible to suppress wind noises attributed to the ventilation resistance.

Shapes of the respective heat sinks (50UI, 50VI and 50WI, 50UO, 50VO, and 50WO) which are arranged in parallel in the circumferential direction of the rotary shaft 13 are congruent or similar to each other, while shapes of the respective heat sinks (50UI and 50UO, 50VI and 50VO, 50WI and 50WO) which are arranged in parallel in the radial direction of the rotary shaft 13 are non-congruent or non-similar from each other. Accordingly, the cooling performance of the semiconductor switching elements 41 in the circumferential direction becomes uniform, while it is possible to make the cooling performance uniform in the radial direction by changing the shapes of the heat sinks corresponding to the air path structure. Further, the pressure loss at the time of allowing the cooling air to pass through the radiation device 50 can be made uniform and hence, the reduction of the air volume and the worsening of the wind noises can be suppressed.

A space SPACE is formed between the heat sinks arranged close to each other in the radial direction of the rotary shaft 13 (between 50UI and 50UO, between 50VI and 50VO, between 50WI and 50WO), and the semiconductor switching elements 41 which are mounted on the respective heat sinks and are arranged close to each other are arranged in the inside of the space SPACE. Accordingly, the cooling air volumes of the heat radiation portions 50FI, 50FO of the respective heat sinks 50UI, 50UO, 50VI, 50VO, 50WI, 50WO are increased and hence, the cooling performance of the semiconductor switching elements 41 can be enhanced.

The air paths of the cooling air for cooling the above-mentioned heat sinks 50UI, 50UO, 50VI, 50VO, 50WI, 50WO are provided corresponding to the respective heat sinks, wherein in the inside of each air path, the heat radiation portions 50FI, 50FO of the corresponding heat sink are arranged. Accordingly, the cooling air paths are also arranged in parallel in the circumferential direction in conformity with the heat sinks and hence, the pressure loss which is generated when the cooling air is allowed to pass through the heat radiation device 50 can be reduced thus suppressing the lowering of the cooling air volume whereby the cooling performance of the semiconductor switching elements can be enhanced. Further, it is also possible to suppress the wind noises attributed to the ventilation resistance.

The ventilation resistance of the cooling air in the space SPACE defined between the heat sinks arranged close to each other in the circumferential direction of the rotary shaft 13 is set larger than the ventilation resistance of the cooling air in the air path where the heat radiation portions 50FI, 50FO of the heat sink are positioned. Accordingly, it is possible to prevent a phenomenon that the cooling air flows into the space SPACE which does not contribute to the cooling between the heat sinks arranged close to each other in the circumferential direction of the rotary shaft 13 and the cooling air volumes which flow in the heat radiation portions 50FI, 50FO of the heat sink are lowered and hence, the cooling air volumes which flow into the heat radiation portions 50FI, 50FO of the heat sink are increased correspondingly whereby the cooling performance of the semiconductor switching element can be enhanced.

The ventilation resistance of the cooling air in the space SPACE defined between the heat sinks arranged close to each other in the radial direction of the rotary shaft 13 is set larger than the ventilation resistance of the cooling air in the air path where the heat radiation portions 50FI, 50FO of the heat sink are positioned. Accordingly, it is possible to prevent a phenomenon that the cooling air flows into the space SPACE which does not contribute to the cooling between the heat sinks arranged close to each other in the radial direction of the rotary shaft 13 and the cooling air volumes which flow in the heat radiation portions 50FI, 50FO of the heat sink are lowered and hence, the cooling air volumes which flow into the heat radiation portions 50FI, 50FO of the heat sink are increased correspondingly whereby the cooling performance of the semiconductor switching element can be enhanced.

The above-mentioned respective heat sinks 50UI, 50UO, 50VI, 50VO, 50WI, 50WO are cooled by cooling air generated by a centrifugal fan 17 which uses the center of rotation of the rotary shaft 13 as the center of rotation thereof, wherein the cooling air ventilation resistance of the cooling air which cools the heat sinks 50UI, 50V1, 50WI on the radially inner side is set larger than the cooling air ventilation resistance of the cooling air which cools the heat sinks 50UO, 50VO, 50WO on the radially outer side. Accordingly, when the fan 17 is formed of a centrifugal fan, although the wind pressure on the center side in the radial direction is large, the ventilation quantity of the heat radiation portion 50FI of the heat sink on the inner side (the center side) in the radial direction and the ventilation quantity of the heat radiation portion 50FO of the heat sink on the outer side (the opposite center side) in the radial direction can be balanced thus making the radiation performance uniform.

The above-mentioned respective heat sinks 50UI, 50UO, 50VI, 50VO, 50WI, 50WO are cooled by cooling air generated by a centrifugal fan 17 which uses the center of rotation of the rotary shaft 13 as the center of rotation thereof, wherein the heat transmission area of the heat sinks 50UI, 50VI, 50WI on the radially inner side to the cooling air is set smaller than the heat transmission area of the heat sinks 50UO, 50VO, 50WO on the radially outer side to the cooling air. Accordingly, when the fan 17 is formed of a centrifugal fan, although the wind pressure on the center side in the radial direction is large, the heat radiation quantity of the heat radiation portion 50FI of the heat sink on the inner side (the center side) in the radial direction and the heat radiation quantity of the heat radiation portion 50FO of the heat sink on the outer side (the center side) in the radial direction can be balanced thus making the temperature distribution uniform and hence, the maximum temperature can be suppressed eventually.

Intake ports 201 for cooling air which cools the heat sinks are arranged in the vicinity of cooling air inflow sides of the heat sinks. Accordingly, the pressure loss attributed to the ventilation from the intake ports 201 for cooling air to the cooling air inflow side can be reduced and hence, the cooling air volume is increased correspondingly whereby the cooling performance of the semiconductor switching elements can be enhanced.

The above-mentioned power supply control is a power supply control of UVW three phases, wherein the plurality of heat sinks which are arranged in parallel to surround the rotary shaft 13 in the circumferential direction of the rotary shaft 13 and to which the plurality of the semiconductor switching elements 41 are mounted in a scattered manner respectively are constituted of the heat sinks 50UI, 50UO for U phase on which the semiconductor switching elements for U phase are mounted, the heat sinks 50VI, 50VO for V phase on which the semiconductor switching elements for V phase are mounted, and the heat sinks 50WI, 50WO for W phase on which the semiconductor switching elements for W phase are mounted. The heat values of the semiconductor switching elements of the heat sinks of respective U, V, W phases are uniform and, further, the cooling abilities of the heat sinks which are split in three and are arranged in parallel in the circumferential direction are also uniform and hence, there is no possibility that the temperature distribution becomes non-uniform among the respective U, V, W phases thus providing the efficient cooling constitution.

The heat sinks 50UI, 50UO, 50VI, 50VO, 50WI, 50WO for respective phases are arranged in an approximately triangular shape such that the heat sinks surround the rotary shaft 13 in the circumferential direction of the rotary shaft 13 (50UI, 50V1, 50WI (50UO, 50VO, 50WO)). Accordingly, it is possible to layout the heat sinks 50UI, 50UO, 50VI, 50VO, 50WI, 50WO in a state that the heat sinks surround the rotary shaft 13 from the circumferential direction and in a wide range in the whole circumferential direction and hence, the layout performance of the heat sinks 50UI, 50UO, 50VI, 50VO, 50WI, 50WO can be enhanced whereby the volumes which the respective semiconductor switching elements 41 and the heat sinks 50UI, 50UO, 50VI, 50VO, 50WI, 50WO occupy can be minimized thus preventing the rotary electric machine from becoming large-sized.

The plurality of semiconductor switching elements 41 and the heat sinks 50UI, 50UO, 50VI, 50VO, 50WI, 50WO are arranged on the rotary electric machine 2 close to each other in the longitudinal direction of the rotary shaft 13 and the occupying area of the semiconductor searching element 41 and the heat sinks 50UI, 50UO, 50VI, 50VO, 50WI, 50WO in the radial direction of the rotary shaft 13 is set to a value within the occupying area in the radial direction in the rotary electric machine part 2. Accordingly, it is possible to prevent the rotary electric machine from becoming large-sized in the radial direction.

Next, in FIG. 2 which is a schematic circuit diagram for explaining the operation of the rotary electric machine part 2 provided with the switching circuit part 4, the rotary electric machine part 2 includes the armature wiring 24 of the stator 16 and the field winding 21 of the rotor 15. As shown in FIG. 1 described above, the pulley 18 which is connected to the rotor 15 is connected to a rotary shaft of the engine (omitted from the drawing) by a belt (omitted from the drawing). Here, the armature winding 24 is constituted by connecting coils of three phases (U phase, V phase, W phase) in the Y connection. The switching circuit part (power element unit) 4 includes an inverter module 40 which is constituted of semiconductor switching elements (power transistors, MOSFETs, IGBTs or the like) 41 capable of performing a high-speed turning ON/OFF and diodes 42 which are connected in parallel to the respective semiconductor switching elements 41, and a smoothing capacitor 43 which is connected in parallel to the inverter module 40.

In the inverter module 40, the switching operations of the respective semiconductor switching elements 41 are controlled in response to commands from the control circuit 44. Further, the control circuit 44 also controls a field current which is made to flow into the field winding 21 of the rotor by controlling the field current control circuit 45.

In the rotary electric machine part 2 which includes the switching circuit part 4, when the engine is started, a DC current is supplied to the switching circuit part 4 from the battery 5 through the DC wiring 8. Further, the control circuit 44 performs the ON/OFF control of the respective semiconductor switching elements 41 of the inverter module 40 so as to convert the DC electric power to the three-phase AC electric power. Further, the three-phase AC electric power is supplied to the armature winding 24 of the rotary electric machine part 2 through the AC wiring 9. Around the field winding 21 of the rotor 15, a rotary magnetic field is generated by the field current supplied from the field current control circuit 45 and hence, the rotor 15 is rotatably driven and the engine is started by way of a rotary electric machine pulley, a belt, a crank pulley and a clutch.

On the other hand, when the engine is started, a rotational force of the engine is transmitted to the rotary electric machine part 2 by way of the crank pulley, the belt and the rotary electric machine pulley. Accordingly, the rotor 15 is rotatably driven and a three-phase AC voltage is induced by the armature winding 24. Here, the ON/OFF control of the respective semiconductor switching elements 41 is performed by the control circuit 44 and hence, the three-phase AC electric power is converted into the DC electric power and the DC electric power which is induced by the armature winding 24 is charged into the battery 5.

Here, the capacitor 43 in FIG. 2 is a smoothing capacitor which plays a role of smoothing the jumping of the voltage or the like and a ceramic capacitor is applicable to the smoothing capacitor. Conventionally, an aluminum electrolytic capacitor or the like is used as the smoothing capacitor and hence, the smoothing capacitor occupies a most portion of the inside of the switching circuit part 4 whereby it is impossible to prevent the whole size of the switching circuit part 4 from becoming large-sized. However, in the embodiment 1, by using the ceramic capacitor as the smoothing capacitor 43, it is possible to largely miniaturize the volume of the capacitor single unit and hence, the miniaturization of the size of the whole switching circuit part 4 is achieved whereby it is advantageous to mount a portion of the rotary electric machine in the inside of the limited space such as the vehicle-mounted rotary electric machine.

Further, the inverter module 40 is, as shown in the drawing, constituted of a U-phase upper arm 46, a U-phase lower arm 47, a V-phase upper arm 48, a V-phase lower arm 49, a W-phase upper arm 56 and a W-phase lower arm 57, wherein each arm is constituted of the semiconductor switching element 41 and the diode 42.

Further, the semiconductor switching elements 41 of the respective arms 46, 47, 48, 49, 56, 57 are, in this embodiment, constituted such that four bare chips are connected to each other in parallel on the corresponding heat sink. The correspondence relationship between the respective arms 46, 47, 48, 49, 56, 57 and the heat sinks 50U1, 50UO for U phase, the heat sinks 50V1, 50VO for V phase, the heat sinks 50W1, 50WO for W phase is as follows. That is, to the inner U-phase heat sink 50UI, four semiconductor switching elements 41 (outlined in the drawing) of the upper arm 46 corresponding to the U phase are connected. Further, to the outer U-phase heat sink 50UO, four semiconductor switching elements 41 (outlined in the drawing) of the lower arm 47 corresponding to the U phase are connected. Hereinafter, in the same manner, to the inner V-phase heat sink 50VI, four semiconductor switching elements 41 (outlined in the drawing) of the upper arm 48 corresponding to the V phase are connected. Further, to the outer V-phase heat sink 50VO, four semiconductor switching elements 41 (outlined in the drawing) of the lower arm 49 corresponding to the V phase are connected. Further, to the inner W-phase heat sink 50WI, four semiconductor switching elements 41 (outlined in the drawing) of the upper arm 56 corresponding to the W phase are connected. Further, to the outer W-phase heat sink 50WO, four semiconductor switching elements 41 (outlined in the drawing) of the lower arm 57 corresponding to the V phase are connected.

In this manner, by connecting the plurality of semiconductor switching elements 41 in parallel, it is possible to decrease the power supply capacitance per one semiconductor switching element and hence, the semiconductor switching elements 41 can be constituted in an inexpensive manner. Further, each one semiconductor switching element 41 can be miniaturized, the degree of freedom in the arrangement including the arrangement in a lateral row or arrangement in symmetry is enhanced. The constitution is advantageous in performing the layout of the semiconductor switching chips 41 in a limited compact state such as the inside of the rotary electric machine such as the electrically-operated power generator.

To the respective heat sinks 50UI, 50UO for U phase, the heat sinks 50VI, 50VO for V phase and the heat sinks 50WI, 50WO for W phase, the semiconductor switching elements 41 of the same number are connected in parallel rows respectively, wherein the number of the parallel rows can be easily changed and hence, the heat sinks can easily cope with the output specifications of the various rotary electric machines.

Further, all of the heat sinks 50UI, 50UO for U phase, the heat sinks 50VI, 50VO for V phase and the heat sinks 50WI, 50WO for W phase are made of good heat conductive metal such as copper, aluminum or the like, for example, and are formed in a shape which conforms to a flow of the cooling air as shown in the drawing and hence, it is possible to efficiently cool the heat-generating semiconductor switching elements 41.

Further, the respective linear proximal portions 50B of the heat sinks 50UI, 50VI, 50WI which correspond to the upper arms 46, 48, 56 have one ends (high potential side) thereof connected to a plus side of a battery 5 through the semiconductor switching elements 41 and another ends (low potential side) thereof connected to the armature winding 24 respectively. On the other hand, the respective linear proximal portions 50B of the heat sinks 50UO, 50VO, 50WO which correspond to the lower arms 47, 49, 57 have one ends (lower potential side) thereof connected to a minus side of the battery 5 through the semiconductor switching elements 41 and another ends (high potential side) thereof connected to the armature winding 24 respectively. That is, the heat sinks 50UI, 50VI, 50WI, 50UO, 50VO, 50WO constitute portions of electric paths through which an armature current flows.

In the rotary electric machine part 2 in FIG. 1, the cooling of the semiconductor switching elements 41 is performed by allowing the cooling air generated by the fan 17 which is fixed to the rotor 15 to pass through the heat sinks 50UI, 50UO, 50VI, 50VO, 50WI, 50WO which are mounted on the semiconductor switching elements 41. The cooling air which is generated by the fan 17 is sucked through the rear-side intake ports 201, passes through the heat radiation portions 50FI, 50FO of the heat sinks 50UI, 50UO, 50VI, 50VO, 50WI, 50WO by way of the ventilation holes 1921 formed in the partition wall portions 192, passes through ventilation holes 111U, 111V, 111W formed in the rear-bracket 11, and is radially discharged in the radially outward direction of the rotor 15 from the rotary center portion of the fan 17.

FIG. 3 is a plan view of the rotary electric machine 2 shown in FIG. 1 as viewed from the rear side in a state that the insert casing 19 and the cover 20 are removed. As clearly illustrated in FIG. 3, the plurality of heat sinks 50UI, 50VI, 50WI, (50UO, 50VO, 50WO) to which the plurality of semiconductor switching elements 41 are mounted are arranged in parallel in a state that the heat sinks surround the rotary shaft 13 in the circumferential direction of the rotary shaft 13 in a common surface which surrounds the rotary shaft 13 of the rotary electric machine part 2. With respect to the plurality of semiconductor switching elements 41 and the plurality of heat sinks 50 which are formed into units for respective phases, the plurality of these units are arranged in the substantially circumferential direction with respect to the rotary shaft of the rotary electric machine. That is, the heat sinks are split in a plural number in the circumferential direction (50UI, 50VI, 50WI (50UO, 50VO, 50WO)) and are arranged in the substantially whole circumferential direction. Further, in conformity with such a constitution of the heat sinks 50, the cooling air path is also split in a plural number in the circumferential direction.

The heat sinks 50UI, 50VI, 50WI (50UO, 50VO, 50WO) and the cooling air path cause a pressure loss when the cooling air is made to pass through the heat sinks and the cooling air path using the fan 17 and hence, it is important for the effective cooling to decrease the ventilation resistance as much as possible and to increase the air volume to the heat radiation portions 50FI, 50FO of the heat sinks 50UI, 50VI, 50WI (50UO, 50VO, 50WO). By arranging the heat sinks 50UI, 50VI, 50WI (50UO, 50VO, 50WO) and the cooling air path parallel to the fan 17, the ventilation resistance is dispersed and hence, the total pressure loss is reduced. Accordingly, the air volume which flows in the heat radiation portions 50FI, FO of the heat sinks is increased thus enhancing the cooling performance. Accordingly, counter measures for ensuring the cooling performance such as the increase of areas of heat transmission surfaces of the heat radiation portions 50FI, 50FO of the heat sinks or the increase of the size of the fan 17 can be suppressed to a minimum and hence, the large-sizing of the whole rotary electric machine 2 can be prevented. Further, by arranging the heat sinks 50UI, 50VI, 50WI (50UO, 50VO, 50WO) and the cooling air path in the circumferentially dispersed manner, it is possible to disperse noise generating sources which generate noises along with the flow of air thus bringing about an advantageous effect that the noises of the whole rotary electric machine 2 can be reduced.

Further, the semiconductor switching elements 41 and the heat sinks (50UI, 50VI, 50WI and 50UO, 50VO, 50WO) are arranged in parallel in a split manner in the substantially radial direction and the cooling air path is also split. Due to such a constitution, the pressure loss is also dispersed in the radial direction thus suppressing the lowering of the cooling air volume. Further, the number of semiconductor switching elements 41 which are mounted on one heat sink can be reduced and hence, the thermal interference between the semiconductor switching elements 41 is suppressed whereby the constitution is advantageous from a viewpoint of cooling. Further, as shown in FIG. 3, by allowing a surface on which the heat sinks 50UI, 50VI, 50WI on the radially inner side are mounted and a surface on which the semiconductor switching element 41 of the heat sinks 50UO, 50VO, 50WO on the radially outer side are mounted to face each other in an opposed manner, it is possible to rationalize the rotary electric machine 2 by shortening electric wiring of the semiconductor switching elements 41 or the like.

In the space SPACE defined between the heat sinks arranged close to each other in the circumferential direction of the heat sinks 50UI, 50VI, 50WI (50UO, 50VO, 50WO) which are arranged in a circumferentially split manner, parts such as a lead line 241 of the stator 16 and a current sensor 2411 are arranged. Further, in portions of the rear bracket 11, the insert casing 19 and the cover 20 which face the above-mentioned space SPACE in the longitudinal direction of the rotary shaft, ventilation holes are not formed. By providing the constitution which allows the rear bracket 11, the insert casing 19 and the cover 20 to seal the space SPACE in the longitudinal direction of the rotary shaft, the ventilation resistance of the cooling air which passes through the space SPACE is increased compared to the ventilation resistance of the cooling air which passes through the heat radiation portions 50FI, 50FO of the heat sinks or is increased approximate the infinity. Accordingly, it is possible to suppress the lowering of the cooling air volume of the heat radiation portions 50FI, 50FO attributed to a phenomenon that the cooling air flows in portions other than the heat transmission surfaces of the heat radiation portions 50FI, 50FO of the heat sinks and hence, the radiation of heat by the heat sinks 50UI, 50VI, 50WI (50UO, 50VO, 50WO) can be efficiently performed. Due to the substantially equal reason, by arranging the semiconductor switching elements 41 in a radially directional space portion defined between the heat sinks (50UI, 50VI, 50WI and 50UO, 50VO, 50WO) which are arranged in parallel in a radially split manner, the ventilation resistance of the cooling air in the space SPACE at the semiconductor switching elements 41 portion is set larger compared to the ventilation resistance of the cooling air which passes through the heat radiation portions 50FI, 50FO or is set to approximate the infinity.

With respect to the respective heat sinks 50UI, 50VI, 50WI, 50UO, 50VO, 50WO which are arranged in parallel in a circumferentially and radially split manner, the respective heat sinks which have the circumferentially juxtaposed relationship have the substantially congruent or similar shape. Accordingly, it is possible to make the ventilation resistances of the heat transmission surfaces of the heat radiation portions 50FI, 50FO of the respective heat sinks uniform in the circumferential direction and hence, it is possible to suppress the irregularities of temperatures of the semiconductor switching elements 41 attributed to the non-uniformity of the cooling performance. Further, the respective heat sinks which have the radially juxtaposed relationship have non-congruent and non-similar shapes, wherein the shapes of the respective heat sinks which have the radially juxtaposed relationship can be changed corresponding to the shape of the cooling air path or the like. Accordingly, it is possible to adjust the cooling air volume which flows in the heat radiation portions 50FI, 50FO of the heat sinks and the heat radiation quantity from the heat transmission surfaces and hence, the cooling performance of the respective heat sinks which have the radially juxtaposed relationship can be made uniform.

In this embodiment, a centrifugal fan is used as the fan 17. In general, the centrifugal fan exhibits the small air volume (the elevation of static pressure being small) on a side opposite to a fan center side compared to the fan center side and hence, when the heat sinks 50UI, 50VI, 50WI and 50UO, 50VO, 50WO are arranged in parallel in the radially split manner, the air volume of the cooling air which flows in the heat radiation portions 50FO of the heat sinks on the opposite-center side (outside in the radial direction) becomes smaller than the air volume of the cooling air which flows in the heat radiation portions 50FI on the center side (inside in the radial direction) Accordingly, in this embodiment, the ventilation resistance of the heat radiation portions 50FI of the heat sinks on the center side is set larger than the ventilation resistance of the heat radiation portions 50FO of the heat sinks on the opposite-center side and hence, the cooling air quantities of the heat radiation portions 50FI, 50FO of the respective heat sinks which have the radially juxtaposed relationship become uniform and the cooling performance is also made uniform. Further, a fin area of the heat radiation portion 50FI of the center-side heat sink is set smaller than a fin area of the heat radiation portion 50FO of the opposite-center-side heat sink and hence, the heat radiation quantity from the heat transmission surface of the heat transmission portion 50FI of the center-side heat sink becomes smaller than the heat radiation quantity from the heat transmission surface of the heat radiation portion 50FO of the opposite-center-side heat sink whereby it is possible to make the cooling performance of the heat radiation portions 50FI, 50FO of the respective heat sinks which have the radially juxtaposed relationship uniform.

The heat sinks 50UI, 50UO, 50VI, 50VO, 50WI, 50WO are split in three in the circumferential direction and electrode parts of respective U, V, W phases are respectively provided to the heat sinks. By radiating the heat generated by the semiconductor switching elements 41 of respective phases U, V, W, by the heat sinks 50UI, 50VI, 50WI (50UO, 50VO, 50WO) which are split in three and are arranged in parallel in the circumferential direction, it is possible to uniformly cool the semiconductor switching elements 41 of respective U, V, W phases. Accordingly, the structure is advantageous from a viewpoint of suppressing the irregularities of temperatures of respective semiconductor switching elements 41.

Further, the heat sinks 50UI, 50VI, 50WI (50UO, 50VO, 50WO) which are split in three and arranged in parallel are arranged in an approximately triangular shape in the circumferential direction and hence, the layout property of the heat sinks 50UI, 50VI, 50WI (50UO, 50VO, 50WO) can be enhanced whereby a volume that the heat sinks 50UI, 50VI, 50WI (50UO, 50VO, 50WO) occupy in the rotary electric machine portion 2 can be suppressed to a minimum thus preventing the large-sizing of the rotary electric machine 2.

FIG. 4 is a plan view of the rotary electric machine 2 shown in FIG. 1 as viewed from a rear side in a state that the insert casing 19 and the cover 20 are mounted on the rotary electric machine 2. As shown in the drawing, in the insert casing 19 and the cover 20 which covers the insert casing 19, ventilation holes 1921 and intake ports 201 for sucking the cooling air are formed. Further, these ventilation holes 1921 and the intake ports 201 are arranged close to the heat radiation portions 50FI, 50FO of the respective heat sinks 50UI, 50UO, 50VI, 50VO, 50WI, 50WO and, at the same time, directly face these heat radiation portions 50FI, 50FO in an opposed manner in the longitudinal direction of the rotary shaft. Accordingly, the cooling air path from these ventilation holes 1921 and the intake ports 201 to the heat radiation portions 50FI, 50FO of the respective heat sinks can be simplified and hence, the pressure loss attributed to the vending of the air flow or the like can be reduced whereby the lowering of the air volume can be suppressed thus realizing the effective cooling.

Next, in conjunction with FIG. 5 and FIG. 6, taking the U phase as a typical example, an example of the method for assembling the bare chips 41B of the semiconductor switching elements 41 and the outer heat sink 50UO for U phase and the structure after assembling is explained.

In FIG. 5 and FIG. 6, four bare chips 41B are bonded to a flat surface of the linear proximal portion 50B of the heat sink 50UO using a good heat conductive bonding material 200 such as solder (first step).

After such bonding, the respective bare chips 41B are bonded by wire bonding 400 to wiring portions 301, 301 which are bonded to the planar surface of the linear proximal portion 50B of the heat sink using a good heat conductive bonding material such as solder thus connecting the respective bare chips 41B and the wiring portions 300 to each other (second step).

After such wire bonding, a resin 500 which collectively seals the respective bare chips 41B and the wiring portions 301 is applied to the heat sink 50UO in a striding manner while allowing output terminal portions 3011, 3021 of the respective wiring portions 301, 302 and the fins 50FO of the heat sink 50UO to be exposed to the outside of the resin 500 (third step).

Conventionally, as shown in FIG. 11, the semiconductor elements 41 are soldered to a metal substrate 600 having an insulation layer 600b formed by containing a high-class material such as silica as a filler, and the metal substrate 600 is fixed to the heat sink 50 by bolts by way of the grease 601. To the contrary, in the embodiment 1 of the present invention, by directly connecting the bare chips 41B of the semiconductor switching elements 41 to the heat sink 50, it is possible to eliminate the expensive metal substrate 200 thus realizing the large reduction of a material cost.

Further, also in the manufacturing steps, it is possible to reduce a conventional mounting step in which the semiconductor elements 41 are mounted on the metal substrate 600 and a conventional assembling step in which grease 601 is applied to the metal substrate 600 and the metal substrate 600 and the heat sink 50 are fixed to each other using bolts whereby the productivity can be enhanced.

Further, by directly bonding the bare chips 41B to the heat sink 50UO made of metal having high heat conductivity such as Al (aluminum) without interposing the conventional metal substrate 600 which has an insulation layer which exhibits the poor heat conductivity, the heat radiation performance of the heat sink 50UO with respect to the semiconductor switching elements 41 (bare chips 41B) which require cooling can be enhanced. Accordingly, it is possible to reduce the size of the heat sink 50UO which occupies a major portion of the switching circuit part 4 whereby it is possible to accommodate the heat sink 50UO in a limited space such as the inside of the vehicle-mounting rotary electric machine, for example.

To cope with the output specification of various rotary electric machines, the number of bare chips 41B of the semiconductor switching elements 41 on the heat sink 50UO can be changed and hence, the present invention can easily cope with various kinds of rotary electric machines. Further, it is possible to provide a low-cost product with respect to various kinds of products.

Usually, with respect to a semiconductor element such as MOSFET or IGBT which is used for power conversion, bare chips are connected to a heat spreader made of metal such as copper, for example, by soldering. By making such a heat spreader unnecessary, and by directly bonding the bare chips 41B of the semiconductor switching elements 41 to the heat sink, the heat resistance is reduced and, at the same time, the heat radiation performance of the heat sink with respect to the bare chips 41B (semiconductor switching elements 41) can be enhanced and hence, it is possible to ensure the sufficient heat content whereby it is possible to suppress the elevation of the temperature of the bare chips 41B (semiconductor switching elements 41).

Further, although a packaged product is used as the semiconductor element conventionally, a connection terminal position is fixed with respect to the packaged product and hence, when the connection is to be performed in the inside of the limited space, there may arise a case in which the connection becomes difficult due to the restriction attributed to the fixed connection terminal position. In the embodiment 1 of the present invention, however, the respective bare chips 41B are bonded by wire bonding 400 to the wiring portions 301, 302 which are bonded to the flat surface on the linear proximal portion 50B of the heat sink using a good heat conductive bonding material such solder or the like thus connecting the respective bare chips 41B and the wiring portions 301, 302 whereby it is possible to use the wiring portion 300 which preliminarily sets the output terminal portions 3011, 3021 thereof at positions where the wiring portions 301, 302 can be easily connected to each of the bare chips 41B.

By connecting the plurality of bare chips 41B to one heat sink instead of connecting one bare chip 41B to one heat sink, the arrangement of the bare chips 41B on the heat sink 50UO may adopt the dispersion arrangement such as the symmetrical arrangement or the parallel arrangement and hence, the efficient heat diffusion can be obtained whereby the heat radiation performance is enhanced. Accordingly, the size of the heat sinks can be further miniaturized. By arranging the respective bare chips 41B while maintaining a fixed distance or more, the thermal interference between the respective bare chips 41B can be attenuated and hence, the temperature elevation of the respective bare chips 41B can be lowered.

As the soldering material which is used for the bonding between the bare chips 41B and the heat sink 50UO and the wire bonding between the bare chips 41B and the wiring portions 301, 302, it is also possible to use a Pb (lead) free solder material by taking an environmental burden into consideration.

As shown in FIG. 5 and FIG. 6, as the resin 500 which collectively seals the respective bare chips 41B, portions of the wiring portions 301, 302 and portions of the heat sink 50UO, a thermosetting resin is used. For example, an epoxy resin is used as the resin 500 and the respective bare chips 41B are collectively molded and are manufactured together with the heat sink 50UO using a transfer molding machine. Further, it is possible to perform the above-mentioned sealing by potting all of the respective bare chips 41B, the portions of the wiring portion 300 and the portions of the heat sink 50UO.

By molding the respective bare chips 41B and the heat sink 50UO together by transfer molding, it is possible to realize the optimum mass productivity and, at the same time, it is also possible to obtain advantageous effects such as the assurance of insulation property, the enhancement of vibration resistance and the interruption of communication with outside air.

Further, since the whole respective bare chips 41B and the heat sink 50UO are fixed by the resin 500, it is also possible to obtain an advantageous effect that the reliability of respective bonding portions using the good heat conductive material 200 can be further enhanced.

The heat radiation portion (fins) 50FO of the heat sink 50UO which is required to possess the high heat radiation property is exposed to the outside of the resin 500, and the exposed heat radiation portion (fins) 50FO is forcibly cooled by the cooling air which is generated by the cooling fan 17 mounted on the rotary shaft 13 and passes through the intake ports 201 and the ventilation holes 111U which correspond to the heat radiation portion (fins) 50F and hence, the cooling performance is further enhanced.

The heat radiation portion 50FO exposed to the outside of the resin 500 is constituted of a plurality of fins and has the structure in which the direction of the plurality of fins and the air path generated by the cooling fan 17 are aligned with each other. Further, lengths of the plurality of fins may not be equal.

As described above, the embodiment 1 of the present invention is directed to the method for assembling semiconductor switching elements 41 and the heat sink 50 in the rotary electric machine which includes the rotary electric machine part 2, the switching circuit part 4 which performs the electricity supply control of the rotary electric machine part 2, and the heat sink 50 which cools the semiconductor switching elements 41 constituting the switching circuit part 4, the switching circuit part 4 and the heat sink 50 being mounted on the rotary electric machine part 2, wherein the method includes the first step in which bare chips 41B of the semiconductor switching elements 41 are bonded to the heat sink 50 using the good heat conductive bonding material 200, the second step which connects the bare chips 41B to the wiring parts 301, 302 by wire bonding 400, and the third step in which the resin 500 which seals the bare chips 41B and the wiring parts 301, 302 is applied to the heat sink 50 in a striding manner in a state that output terminal portions 3011, 3021 of the wiring parts 301, 302 and fins 50F of the heat sink 50 are exposed to the outside of the resin 500. Further, the embodiment 1 of the present invention is also directed to the rotary electric machine which includes the rotary electric machine part 2, the switching circuit part which 4 performs the electricity supply control of the rotary electric machine part 2 and the heat sink 50 which cools the semiconductor switching elements 41 which constitute the switching circuit part 4, the switching circuit part 4 and the heat sink 50 being mounted on the rotary electric machine part 2, wherein bare chips 41B of the semiconductor switching elements 41 are bonded to the heat sink 50 using the good heat conductive bonding material 200. Accordingly, the heat spreader which is present below the chip as found in the conventional package-type semiconductor elements can be eliminated and hence, the heat diffusion can be enhanced and the heat radiation property of the heat generating elements can be enhanced whereby the size of the heat sink can be reduced. Further, in the rotary electric machine such as an electrically-operated generator or the like having an inverter function, conventionally, semiconductor elements are mounted on the expensive metal substrate or the like. However, by applying a potential to the heat sink 50 and by directly mounting the bare chips 41B of the semiconductor switching elements 41 on the heat sink 50, the conventional metal substrate (copper pattern, insulation layer, base metal) becomes unnecessary and hence, the heat resistance can be largely reduced whereby the miniaturization of the size of the heat sink and the reduction of the material cost of the substrate can be realized. Further, the step for coating grease between the heat sink and the metal substrate and the step for fixing them by bolts which have been necessary conventionally also become unnecessary and hence, the productivity is enhanced. Further, when the semiconductor switching element 41 is formed of the conventional package product, the connection terminal position is fixed and hence, the wiring and the connection are difficult. However, in the embodiment of the present invention, it is possible to connect the bare chips 41B of the semiconductor switching elements 41 and the winding portions 301, 302 independently by wire bonding and hence, the wiring and connection structure from the semiconductor switching elements 41 to the surrounding can be rationalized whereby the operability of the wiring and connection can be enhanced.

Further, in the embodiment 1 of the present invention, the bare chips of the plurality of semiconductor switching elements are arranged in parallel on the heat sink and hence, different from the conventional large-sized chip arrangement structure, the number of the bare chips 41B of the semiconductor switching elements 41 is set to a plural number and the bare chips 41B are dispersed whereby the heat radiation property is enhanced leading to the miniaturization of the heat sink. Further, the number of bare chips 41B can be changed so as to flexibly cope with various specifications of rotary electric machines. Further, with respect to the various kinds of products, it is possible to provide a low-cost product.

Further, in the embodiment 1 of the present invention, the plurality of bare chips 41B are arranged in parallel in a spaced-apart manner and hence, by allowing the arrangement position of the bare chips 41B to have the arm symmetrical or parallel arrangement, the heat generating sources can be dispersed thus ensuring the efficient heat diffusion and the enhancement of the heat radiation property whereby the heat sink 50 and the switching circuit part 4 which have been large-sized can be miniaturized. Further, the thermal interference between the semiconductor elements can be alleviated and hence, the total temperature elevation can be lowered thus providing the semiconductor elements which sufficiently satisfy the heat resistance.

Further, in this embodiment 1 of the present invention, the interval between the plurality of bare chips 41B is set to the uniform interval and hence, by arranging the bare chips 41B at a fixed distance or more, it is possible to prevent the heat receiving interference between the respective bare chips 41B thus ensuring the favorable heat diffusion property.

Further, the embodiment 1 of the present invention adopts the structure in which the wiring portions 301, 302 which are connected to the bare chips 41B by wire bonding 400 are mounted on the heat sink 50 and, after wire bonding 400, the resin 500 which seals the bare chips 41B and the wiring portions 301, 302 is applied to the heat sink 50 in a striding manner, and the output terminal portions 3011, 3021 of the wiring portions 301, 302 and the fins 50F of the heat sink 50 are exposed to the outside of the resin 500. Accordingly, by collectively sealing the bare chips 41B and the heat sinks 50 using the resin 500, it is possible to easily ensure the insulation property of the respective electrodes of the bare chips 41B and, at the same time, the reliability of the bonding portions between the bare chips 41B and the heat sink 50 and the bonding portion of the bare chips 41B and the wire bonding 400 portion can be enhanced. Further, it is also possible to easily obtain the favorable vibration resistance. Still further, the heat radiation portions (fins) 50FI, 50FO of the heat sink are exposed to the outside of the resin 500 and hence, the heat radiation portions 50FI, 50FO can be efficiently cooled with the cooling air.

Further, in the embodiment 1 of the present invention, the plurality of bare chips 41B are connected to the common wiring portions 301, 302 by wire bonding 400 and hence, the electrodes from the respective bare chips 41B are connected to the wiring portions 301, 302 thus rationalizing the wiring such that one output terminal is formed, and the output terminal is exposed to the outside. Accordingly, it is possible to perform the connection of the bare chips with other heat sinks easily and in a simplified manner. Further, since the bare chips 41B are sealed with resin, the insulation of respective electrodes of the respective bare chips 41B can be also easily ensured.

Further, in the embodiment 1 of the present invention, the heat sinks are provided for respective phases, and the heat sinks of the respective phases surround the rotary shaft of the rotary electric machine part in the circumferential direction of the rotary shaft and hence, it is possible to further reduce the dedicated space along with the miniaturization whereby it is further advantageous in mounting the rotary electric machine in the limited space.

Embodiment 2

Figure 7:
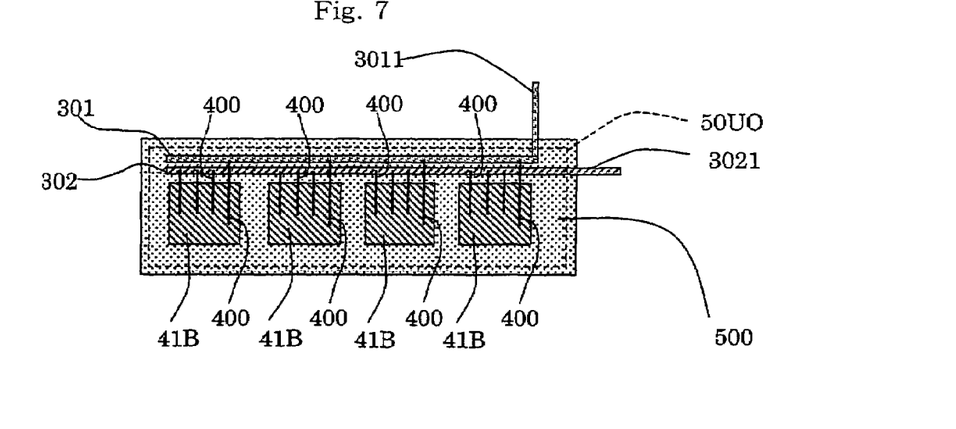
FIG. 7 is a view showing the embodiment 2 of the present invention and also is a lateral cross-sectional plan view showing an example of the structure after assembling semiconductor switching elements and a heat sink in a cross section.

The embodiment 2 of the present invention is explained hereinafter in conjunction with FIG. 7. FIG. 7 is a lateral cross-sectional plan view showing an example of the structure after the semiconductor switching elements and the heat sink are assembled to each other in cross section, wherein parts identical or similar to the parts shown in the above-mentioned FIG. 5 and FIG. 6 are given same symbols. Here, the explanation of the embodiment 2 is made hereinafter by mainly focusing on portions which make this embodiment 2 different from the above-mentioned embodiment 1 and the explanation of other portions is omitted.

The above-mentioned FIG. 6 shows the example of the case in which the wiring portions 301, 302 are arranged on both sides of each bare chip 41B, and the output terminal portions 3011, 3021 of the wiring portions 301, 302 are exposed on the same side and extend in the same direction. In FIG. 7 which shows the embodiment 2, the wiring portions 301, 302 are arranged on the same side of each bare chip 41B, and output terminal portions 3011, 3021 of the wiring portions 301, 302 are exposed on the different side and extend in the different direction.

Embodiment 3

Figure 8:
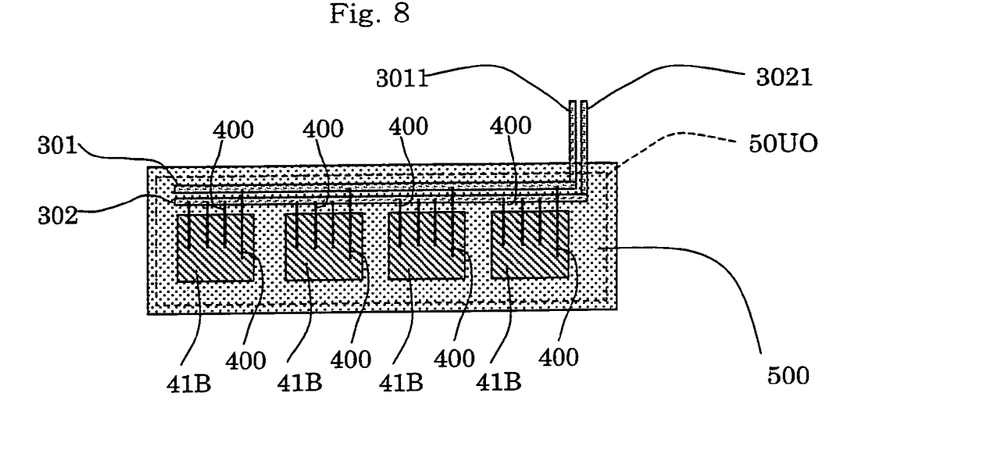
FIG. 8 is a view showing the embodiment 3 of the present invention and also is a lateral cross-sectional plan view showing an example of the structure after assembling semiconductor switching elements and a heat sink in a cross section.

The embodiment 3 of the present invention is explained hereinafter in conjunction with FIG. 8. FIG. 8 is a lateral cross-sectional plan view showing an example of the structure after the semiconductor switching elements and the heat sink are assembled to each other in cross section, wherein parts identical or similar to the parts shown in the above-mentioned FIG. 5 to FIG. 7 are given same symbols. Here, the explanation of the embodiment 3 is made hereinafter by mainly focusing on portions which make this embodiment 3 different from the above-mentioned embodiments 1, 2 and the explanation of other portions is omitted.

The above-mentioned FIG. 6 shows the example of the case in which the wiring portions 301, 302 are arranged on both sides of each bare chip 41B, and the output terminal portions 3011, 3021 of the wiring portions 301, 302 are exposed on the same side and extend in the same direction. In FIG. 8 which shows the embodiment 3, the wiring portions 301, 302 are arranged on the same side of the respective bare chips 41B. On the other hand, the output terminal portions 3011, 3021 of the wiring portions 301, 302 are exposed on the same side and extend in the same manner as in the case shown in the above-mentioned FIG. 6.

By forming the semiconductor switching elements 41 using the bare chips 41B, by bonding the bare chips 41B onto the heat sink 50 using the good heat conductive bonding material 200, and by connecting the bare chips 41B to the wiring portions 301, 302 by wire bonding 400, the positions of the wiring portions 301, 302 and the positions of the output terminal portions 3011, 3021 of the wiring portions 301, 302 can be arbitrarily selected depending on the necessity as shown in the above-mentioned FIG. 6 to FIG. 8 and hence, in installing the heat sinks in the limited portion in the inside of the limited space such as the inside of an engine room of an automobile, the inside of the rotary electric machine part or the like, the degree of freedom of selecting the installing position is increased.

Embodiment 4

Figure 9:
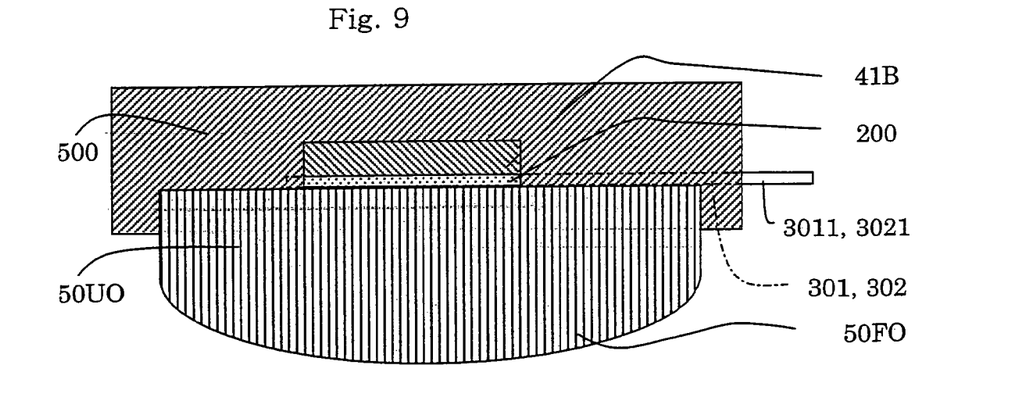
FIG. 9 is a view showing the embodiment 4 of the present invention and also is a longitudinal cross-sectional side view showing an example of the structure after assembling semiconductor switching elements and a heat sink in a cross section.

The embodiment 4 of the present invention is explained hereinafter in conjunction with FIG. 9. FIG. 9 is a longitudinal cross-sectional side view showing an example of the structure after the semiconductor switching elements and the heat sink are assembled to each other in cross section, wherein parts identical or similar to the parts shown in the above-mentioned FIG. 5 to FIG. 8 are given same symbols. Here, the explanation of the embodiment 4 is made hereinafter by mainly focusing on portions which make this embodiment 4 different from the above-mentioned embodiments 1 to 3 and the explanation of other portions is omitted.

The embodiment 4 of the present invention is, as shown in FIG. 9, characterized in that the whole distal-end-portion shape of a plurality of fins which constitute the heat radiation portion 50FO of the heat sink 50UO as viewed in the extending direction of the plurality of fins is formed into a curved shape. In this manner, by forming the distal-end-portion shape of the plurality of fins which constitute the heat radiation portion 50FO of the heat sink 50UO as viewed in the extending direction of the plurality of fins into the curved shape, for example, as illustrated in the above-mentioned FIG. 3, by forming the distal-end-portion shape of the plurality of fins into the curved shape which conforms to a circumferential surface of the casing 100 of the rotary electric machine part 2 or an inner peripheral surface of the insert casing 19 shown in FIG. 1, it is possible to allow the cooling air to pass through the plurality of fins which constitute the heat radiation portions 50FO in a concentrated manner. Further, the occupying area of the heat sink 50UO mounted on the rotary electric machine can be decreased thus realizing the miniaturization of the rotary electric machine provided with the rotary electric machine part 2, the switching circuit part 4 which performs the current supply control of the rotary electric machine part, and the heat sinks 50 for cooling the semiconductor switching elements which constitute the switching circuit part.

Embodiment 5

Figure 10:
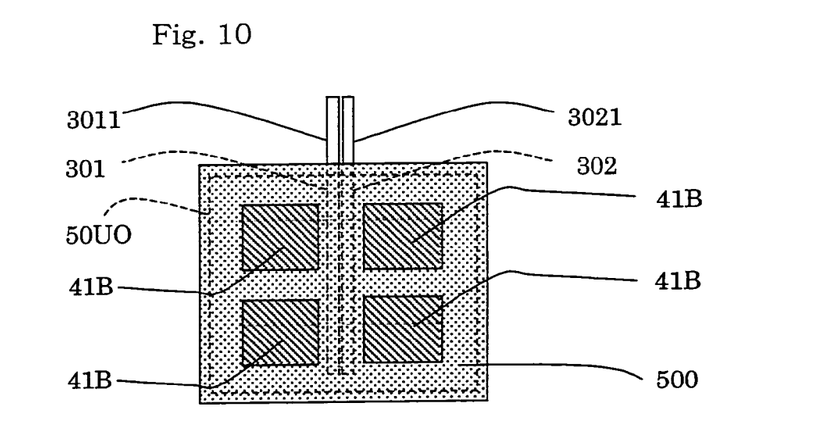
FIG. 10 is a view showing the embodiment 5 of the present invention and also is a lateral cross-sectional plan view showing an example of the structure after assembling semiconductor switching elements and a heat sink in a cross section.

The embodiment 5 of the present invention is explained hereinafter in conjunction with FIG. 10. FIG. 10 is a lateral cross-sectional side view showing an example of the structure after the semiconductor switching elements and the heat sink are assembled to each other in cross section, wherein parts identical or similar to the parts shown in the above-mentioned FIG. 5 to FIG. 9 are given same symbols. Here, the explanation of the embodiment 5 is made hereinafter by mainly focusing on portions which make this embodiment 5 different from the above-mentioned embodiments 1 to 4 and the explanation of other portions is omitted.

The embodiment 5 of the present invention is characterized in that, as shown in FIG. 10, in bonding a plurality of bare chips 41B to the heat sink 50UO, the respective bare chips 41B are not arranged in a row but are arranged in a multiple-parallel-row and symmetrical arrangement so as to enhance the heat diffusion property and the heat radiation property thus realizing the miniaturization of the size of the heat sink.

Here, in all of these embodiments 1 to 5, the explanation has been made with respect to the example of the assembling method of the bare chips 41B of the semiconductor switching elements 41 and the outer heat sink 50UO for U phase and the structure after assembling by taking the U phase as the typical example, the assembling method of the inner heat sink 50UI of U phase, the respective outer and inner heat sinks 50VO, 50VI, 50WO, 50WI of V phase and W phase and the corresponding bare chips 41B of the semiconductor chips 41 and structures after assembling are also equal to the above-mentioned assembling method in the outer heat sink 50UO for U phase and the structure after assembling and these methods and the structures can also obtain the equal advantageous effects as the above-mentioned assembling method in the outer heat sink 50UO for U phase and the structure after assembling.

What is claimed is:

1. A method for assembling semiconductor switching elements and a heat sink in a rotary electric machine, for an automobile, which has a plurality of phases and which includes a rotary electric machine part having a rotary shaft, an inverter which has an upper arm and a lower arm for each phase and which performs an electricity supply control of the rotary electric machine part, and a heat sink which is provided for each arm and each of which cools a plurality of respective semiconductor switching elements constituting the arm, each of the upper arm and the lower arm for each phase having the plurality of semiconductor switching elements, the plurality of semiconductor switching elements and the heat sink being mounted on the rotary electric machine part and surrounding the rotary shaft in the circumferential direction of the rotary shaft, wherein the method includes:

a first step in which a plurality of bare chips of the plurality of semiconductor switching elements are arranged in parallel in a spaced apart manner and are directly bonded to each heat sink using a good heat conductive bonding material, and wiring parts are arranged in a spaced apart manner and are directly bonded to each heat sink using a good heat conductive bonding material;

a second step which connects the bare chips to the wiring parts by wire bonding, the second step being the step after the first step; and a third step in which a resin collectively molds and seals the bare chips, the wiring parts, and the heat sink in a state that output terminal portions of the wiring parts and fins of the heat sink are exposed to the outside of the resin, the third step being the step after the second step.

2. A rotary electric machine, for an automobile, having a plurality of phases, and comprising a rotary electric machine part having a rotary shaft;

an inverter which has an upper arm and a lower arm for each phase and which performs an electricity supply control of the rotary electric machine part; and a heat sink which is provided for each arm and each of which cools a plurality of respective semiconductor switching elements which constitute the arm, each of the upper arm and the lower arm for each phase having the plurality of semiconductor switching elements, the plurality of semiconductor switching elements and the heat sink being mounted on the rotary electric machine part and surrounding the rotary shaft in the circumferential direction of the rotary shaft, wherein a plurality of bare chips of the plurality of semiconductor switching elements are directly bonded to each heat sink by a good heat conductive bonding material, the plurality of bare chips are arranged in parallel in a spaced-apart manner on the respective heat sink, a plurality of wiring parts connected to the plurality of bare chips are directly bonded to each heat sink by a good heat conductive bonding material, the plurality of wiring parts being arranged in a spaced apart manner; and a resin mold which collectively molds and seals the bare chips, the wiring parts, and the heat sink in a state that output terminal portions of the wiring parts and fins of the heat sink are exposed to the outside of the resin mold.

3. A rotary electric machine for an automobile according to claim 2, wherein an interval among the plurality of bare chips is set uniform.

4. A rotary electric machine for an automobile according to claim 3, wherein the heat sink includes a plurality of fins and a distal-end-portion shape of the whole of the plurality of fins as viewed in the extending direction of the fins is formed in a curved shape.

5. A rotary electric machine for an automobile according to claim 4, wherein the distal-end-portion shape of the whole of the plurality of fins is formed in a curved shape along an inner peripheral surface of a casing of the rotary electric machine part.

6. A rotary electric machine for an automobile according to claim 3, wherein the plurality of bare chips are connected to the common wiring portion by wire bonding.

7. A rotary electric machine for an automobile according to claim 2, wherein the heat sink includes a plurality of fins and a distal-end-portion shape of the whole of the plurality of fins as viewed in the extending direction of the fins is formed in a curved shape.

8. A rotary electric machine for an automobile according to claim 7, wherein the distal-end-portion shape of the whole of the plurality of fins is formed in a curved shape along an inner peripheral surface of a casing of the rotary electric machine part.

9. A rotary electric machine for an automobile according to claim 2, wherein the plurality of bare chips are connected to the common wiring portion by wire bonding.

* * * * *